US007006162B2

(12) United States Patent
Cowley et al.

(10) Patent No.: US 7,006,162 B2
(45) Date of Patent: Feb. 28, 2006

(54) TUNER

(75) Inventors: Nicholas Paul Cowley, Wroughton (GB); Arshad Madni, Swindon (GB)

(73) Assignee: Zarlink Semiconductor Limited, (GB)

( * ) Notice: Subject to any disclaimer, the term of this patent is extended or adjusted under 35 U.S.C. 154(b) by 409 days.

(21) Appl. No.: 09/971,468

(22) Filed: Oct. 5, 2001

(65) Prior Publication Data

US 2002/0071653 A1   Jun. 13, 2002

(30) Foreign Application Priority Data

Oct. 6, 2000   (GB)   .................................... 0024480

(51) Int. Cl.
*H04N 5/44* (2006.01)
*H04N 5/50* (2006.01)
(52) U.S. Cl. .................... 348/731; 348/725; 455/187.1
(58) Field of Classification Search ................ 348/731, 348/732, 733, 725, 729; 455/138, 179.1, 455/180.1, 188.1, 187.1, 191.1, 250.1, 251.1; 334/18, 17; 331/2, 16, 43
See application file for complete search history.

(56) References Cited

U.S. PATENT DOCUMENTS

| 4,340,975 | A | * | 7/1982 | Onishi et al. ................ 455/315 |
| 4,801,900 | A | * | 1/1989 | Mower ........................ 332/170 |
| 5,200,826 | A | * | 4/1993 | Seong ......................... 348/731 |
| 5,410,743 | A | * | 4/1995 | Seely et al. .................. 455/326 |
| 5,521,650 | A | * | 5/1996 | Ku .............................. 348/731 |
| 5,548,831 | A |   | 8/1996 | Bijker et al. |
| 5,697,087 | A | * | 12/1997 | Miya et al. .................. 455/307 |
| 5,737,035 | A | * | 4/1998 | Rotzoll ........................ 348/725 |
| 5,847,612 | A | * | 12/1998 | Birleson ........................ 331/2 |
| 5,892,799 | A | * | 4/1999 | Jaakkola ..................... 375/340 |
| 5,953,636 | A | * | 9/1999 | Keate et al. ................. 455/3.02 |
| 5,963,842 | A | * | 10/1999 | Kinugawa ..................... 725/68 |
| 6,014,547 | A | * | 1/2000 | Caporizzo et al. .......... 725/151 |
| 6,094,236 | A | * | 7/2000 | Abe et al. .................... 348/731 |
| 6,127,962 | A | * | 10/2000 | Martinson ..................... 342/20 |
| 6,137,852 | A | * | 10/2000 | McGinn et al. ............. 375/375 |
| 6,177,964 | B1 | * | 1/2001 | Birleson et al. ............ 348/725 |
| 6,307,599 | B1 | * | 10/2001 | Komatsu ..................... 348/731 |
| 6,639,630 | B1 | * | 10/2003 | Osada et al. ................ 348/731 |
| 6,714,776 | B1 | * | 3/2004 | Birleson ..................... 455/302 |

FOREIGN PATENT DOCUMENTS

EP   0716512   6/1996

OTHER PUBLICATIONS

Rudell, Jacques C., *A 1.9 GHz Wide-Band IF Double Conversion CMOS Integrated Receiver for Cordless Telephone Applications*, J. Solid-State Circuits, vol. 32, No. 12 (Dec. 1997).

Hutson, Geoffrey H., et al., *Color Television*, McGraw-Hill Book Company, p. 104-105 (1990).

* cited by examiner

*Primary Examiner*—John Miller
*Assistant Examiner*—Jean W. Désir
(74) *Attorney, Agent, or Firm*—Thompson Hine LLP

(57) ABSTRACT

An analogue single conversion tuner comprises a plurality of channels (1, 2, 3) for covering the whole of a desired reception bandwidth. Each tuner comprises an image reject mixer (18) connected to the tuner input (4) by a single tracking filter (16), for example of the single-tuned type.

9 Claims, 2 Drawing Sheets

TUNER

FIELD OF THE INVENTION

The present invention relates to an analogue single conversion tuner, for example for use in television tuners of television receivers and video cassette recorders.

BACKGROUND

Known analogue television tuners, for example in television receivers and video cassette recorders, are based on single conversion superheterodyne techniques in which a required radio frequency channel undergoes a single frequency conversion to an intermediate frequency before demodulation. In a typical application of such a tuner, the received bandwidth may be from about 50 to about 900 MHz or a substantial portion thereof and the intermediate frequency (IF) is typically in the region of 30 to 50 MHz, depending on which regional modulation standard is applied. Also, received channels may vary widely in received signal strength depending upon distance from a transmitter and this is referred to as the "far near effect".

Because of the use of a single conversion technique and because the IF is substantially less than the transmitted band, the image frequency is within the transmitted band at a frequency which may be occupied by another channel. Because of the far near effect, this undesired channel may be of greater amplitude than the desired channel.

Groups of channels tend to be transmitted in clusters which occupy a smaller part of the received bandwidth. Although provision may be made for spatially separating such channels so that they are much less likely to interfere with each other, this is not always the case. In any case, the far near effect may result in strong potentially interfering channels occupying neighbouring frequencies to desired channels.

It is thus a requirement for such tuners to provide sufficient image rejection and cross modulation and intermodulation protection from interfering signals. In known television tuners, this is achieved by pre-filtering the received channels so that substantially only the desired channel is supplied to the frequency changing mixer. Provided potentially interfering signals are sufficiently attenuated, the desired channel can be selected and demodulated with acceptable performance. Such pre-filtering is provided by a plurality of filters between the mixer and the input to the tuner. However, because the tuner must be capable of tuning so as to select different channels, the filters must also be capable of tuning and must track the frequency of the local oscillator whose signal is also supplied to the mixer.

In practice, using low cost varactor diodes for performing the tuning function, a tuning range of only one or maybe 1.2 octaves can be achieved. It is therefore common practice to divide a tuner into three dependent channels for providing adequate frequency coverage of the whole received bandwidth within which desired channels may occur. Each of these independent channels requires its own tracking filters.

The local oscillator frequency also lies within the received bandwidth and it is therefore necessary to suppress re-radiation of the local oscillator signal from the tuner so as to prevent interference with other tuners. This is generally achieved by a further tracking filter for suppressing the local oscillator re-radiation.

A typical known type of single conversion television tuner thus contains three independent channels or bands, each of which has two sets of tracking filters which must provide sufficiently high Q to attenuate neighbouring potentially interfering channels (in the case of image filtering) and little or no attenuation to the desired channel (in the case of the local oscillator suppression filter). All of these filters must accurately track the frequency of the local oscillator.

The required tracking accuracy may be achieved by alignment during production of the television tuner or by some form of automatic alignment algorithm within the tuner. Production alignment requires an iterative adjustment during production whereas automatic alignment requires an iterative adjustment during use of a tuner. Both techniques involve significant costs.

FIG. 1 of the accompanying drawings illustrates the architecture of a typical known type of analogue television tuner, for example as disclosed in. "Colour Television" by Hutson, Shepherd and Brice, McGraw Hill, p104, ISBN 0-07-084199-3. The tuner comprises three channels or bands 1, 2, 3 of substantially identical arrangement or architecture but differing in the frequency ranges which they cover. The first channel 1 is designed to cover the band V1, the second channel 2 is designed to cover the band V3 and the third channel 3 is designed to cover the band U. Because the channels are substantially identical, only channel 1 will be described, channels 2 and 3 having the same structure. A tuner input 4 is connected to the inputs of the channels 1 to 3. In channel 1, the input is connected to a band limit filter 5 which limits the incoming bandwidth to the range covered by the channel 1. The band limit filter 5 can therefore have a fixed frequency response and, in particular, is not required to track the local oscillator frequency.

The output of the filter 5 is supplied to a single-tuned tracking filter 6 whose frequency is controlled by a varactor diode 7 in response to a tuning voltage supplied to an input 8. The filter 6 tracks the local oscillator frequency so as to suppress re-radiation of the local oscillator signal without substantially attenuating the desired channel.

The output of the filter 6 is supplied via an automatic gain control circuit 9 to a double-tuned tracking filter 10 which is tuned by varactor diodes 11 and 12 in accordance with the tuning voltage at the input 8. The filter 10 is an image reject filter for rejecting the image channel and has a bandwidth which is centred on the frequency of the desired channel with a −3 dB bandwidth marginally greater than the bandwidth of the desired channel. The output of the filter 10 is supplied to a mixer 13 which also receives the local oscillator signal from a local oscillator 14 which is tuned by a varactor diode 15 controlled by the control voltage at the input 8. The local oscillator frequency is generally equal to the radio frequency of the desired channel plus the intermediate frequency. The capacitances of the varactor diodes 7, 11, 12 and 15 vary in accordance with the tuning voltage and change the resonant frequencies of the networks with which they are associated. As is known, the resonant networks are aligned during manufacture such that, over the tuning voltage range, the centre frequencies of the various networks maintain the correct relative values or alignment.

This type of tuner has several disadvantages. For example, the radio frequency path between the input and the mixer of each channel or band 1, 2, 3 contains at least two tracking filters. The tracking filters must be aligned during manufacture or a dynamic alignment algorithm must be provided to maintain alignment during operation. Both techniques involve substantial cost. Also, in order to achieve the appropriate alignment, the varactor diodes 7, 11, 12, 15 must be well-matched. This increases component cost and causes difficulties in selecting a replacement diode if one of the diodes fails during use.

SUMMARY OF THE INVENTION

According to a first aspect of the invention, there is provided an analogue single conversion tuner comprising an image reject mixer, characterised by a single tracking filter between the mixer and a tuner input.

The single tracking filter may be a bandpass filter.

The single tracking filter may be single-tuned.

An automatic gain control circuit may be disposed between the mixer and the single tracking filter.

A fixed-tuned band limit filter may be disposed between the single tracking filter and the tuner input.

According to a second aspect of the invention, there is provided a television tuner comprising at least one tuner according to the first aspect of the invention.

According to a third aspect of the invention, there is provided a television receiver comprising a television tuner according to the second aspect of the invention.

According to a fourth aspect of the invention, there is provided a video cassette recorder comprising a television tuner according to the second aspect of the invention.

It is thus possible to provide a tuner of simplified construction and reduced cost. By reducing the required selectivity ahead of the mixer, a relatively coarse production alignment may be used, thus reducing the cost of production alignment and removing the need for automatic alignment during use, which also reduces the cost. No image reject filtering is required and a single relatively low Q tracking filter is provided ahead of the mixer. Provided the mixer has a sufficiently wide dynamic range, acceptable performance can be achieved with a significant reduction in cost and increased ease of manufacture as compared with known tuner architectures.

BRIEF DESCRIPTION OF THE DRAWINGS

The invention will be further described, by way of example, with reference to the accompanying drawings, in which.

Like reference numerals refer to like parts in the drawings.

DETAILED DESCRIPTION

Figure 1:
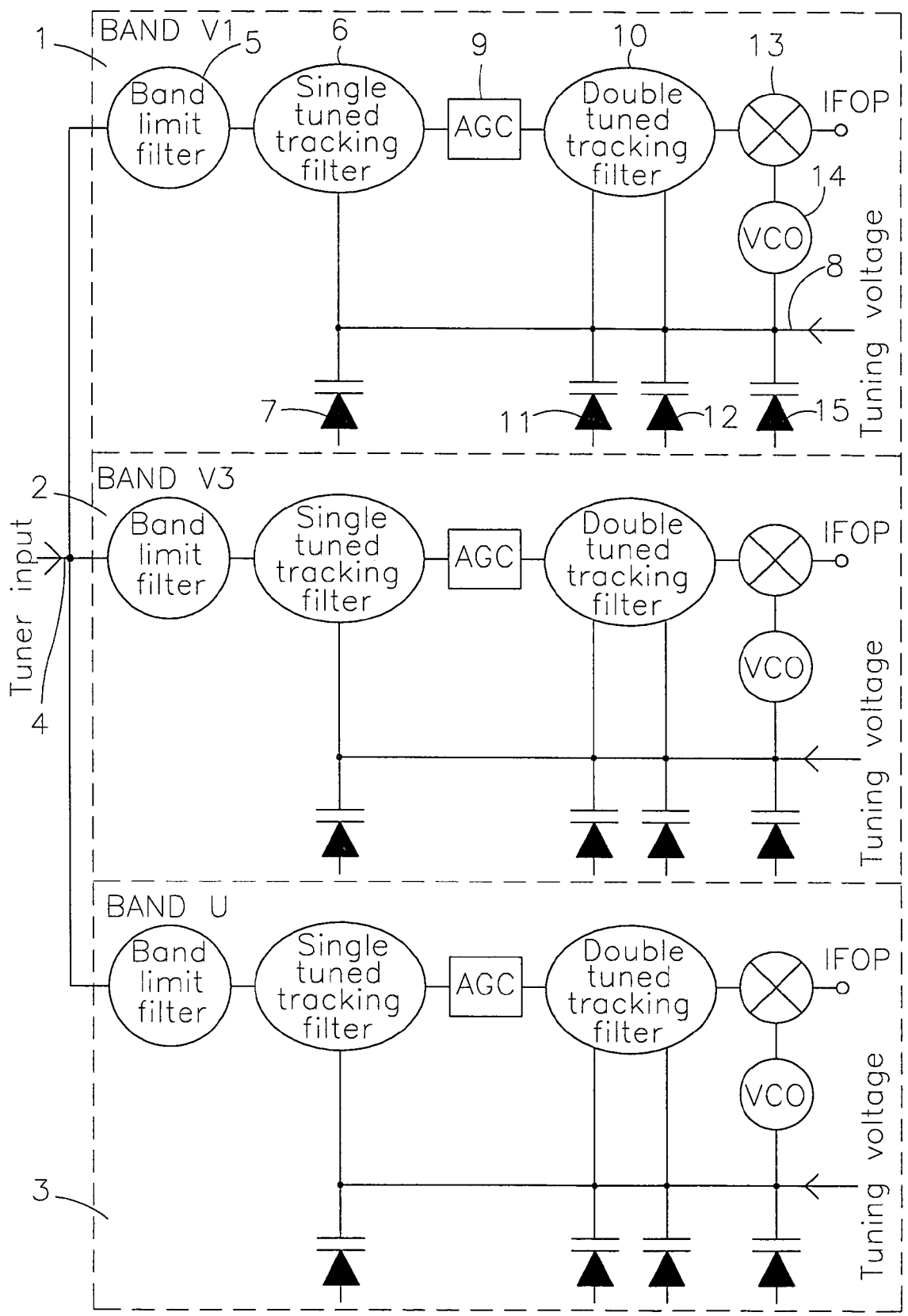
FIG. 1 is a block schematic diagram of a known type of analogue single conversion television tuner.
Figure 2:
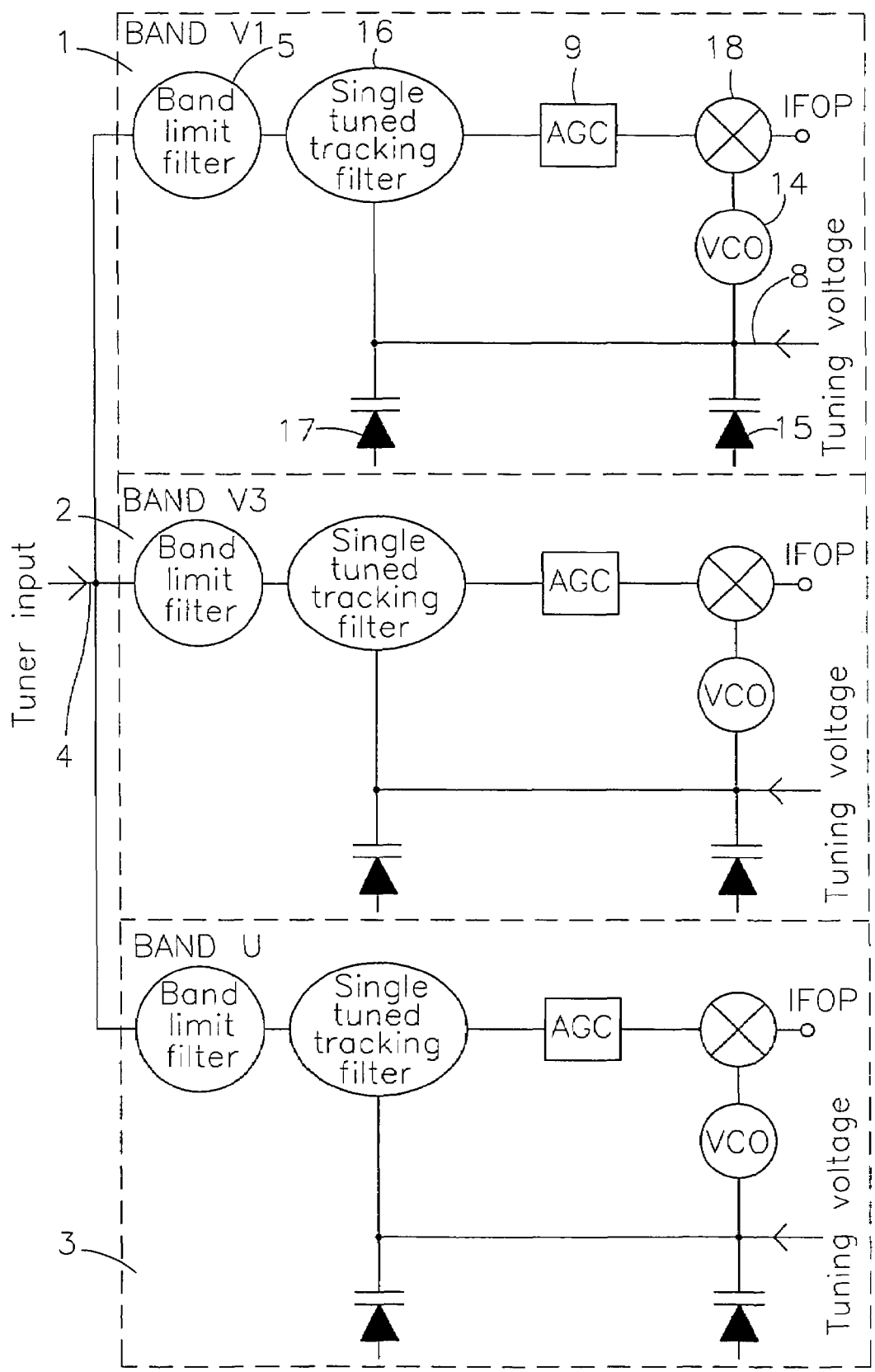
FIG. 2 is a block schematic diagram of an analogue single conversion television tuner constituting an embodiment of the invention.

The tuner of FIG. 2 comprises the three bands or channels 1, 2, 3 as in the tuner of FIG. 1. Again, as the three channels are substantially identical other than for their frequency coverage, only the channel 1 will be described.

The channel 1 shown in FIG. 2 differs from that shown in FIG. 1 in that the single-tuned image reject filter 6 and the associated diode are omitted, as are the double-tuned tracking filter 10 and associated diodes 11 and 12. Instead, a single-tuned tracking filter 16 is disposed between the band limit filter 5 and the AGC circuit 9. The filter 16 is aligned to the desired channel and is required to track with the local oscillator frequency. However, because the filter 16 is of relatively low Q type, the alignment can be relatively coarse because the roll-off in frequency response is relatively shallow so that misalignments during tracking do not significantly affect the performance of the tuner.

The channel 1 shown in FIG. 2 also differs from that shown in FIG. 1 in that the mixer 13 is replaced by an image reject mixer 18 whose operation is such as to reject the image channel and so substantially prevent interference therewith. The use of an image reject mixer thus allows image reject filtering to be omitted. Image reject mixers are known and a typical example is disclosed in J. C. Rudell, J. J. Ou, T. Cho, G. Chien, F. Brianti, J. Weldon and P. R. Gray, "A 1.9 Ghz Wide-Band IF Double Conversion CMOS Integrated Receiver for Cordless Telephone Applications", J. Solid-State Circuits, Vol 32 No. 12, December 1997, the contents of which are incorporated herein by reference.

By using an image reject mixer 18 having a very wide dynamic range, the effect of products of relatively high amplitude interference channels passing to the mixer 18 because of the reduced selectivity ahead of the mixer can be reduced to a sufficient extent to provide acceptable performance. Thus, in addition to being of the image reject type, the mixer is required to produce low levels of intermodulation and cross modulation effects even in the presence of relatively high potentially interfering signals.

This arrangement allows the cost of the tuner to be significantly reduced compared with known types of tuner, for example as shown in FIG. 1. For example, a significant number of active devices may be omitted from the tuner, thus reducing its complexity. Also, alignment requirements are substantially reduced because only a single tracking filter is required to be aligned coarsely with the local oscillator. Also, it is not necessary for the varactor diodes 15 and 17 to be accurately matched, thus reducing the cost of the components and reducing the difficulty in effecting repairs if a varactor diode needs to be replaced.

What is claimed is:

1. An analog single conversion tuner comprising: a tuner input; an image reject mixer adapted to perform image rejection by phase cancellation; and a single tracking filter between said mixer and said tuner input, wherein said single tracking filter is of a relatively low Q type and said image reject mixer has a sufficiently wide dynamic range to reduce the effect of relatively high amplitude interference signals able to pass through said relatively low Q type tracking filter to said image reject mixer.

2. A tuner as claimed in claim 1, in which said single tracking filter is a bandpass filter.

3. A tuner as claimed in claim 1, in which said single tracking filter is single-tuned.

4. A tuner as claimed in claim 1, comprising an automatic gain control circuit disposed between said mixer and said single tracking filter.

5. A tuner as claimed in claim 1, comprising a fixed-tuned band limit filter disposed between said single tracking filter and said tuner input.

6. A tuner as claimed in claim 1, comprising a television tuner.

7. A television receiver comprising an analog single conversion television tuner which comprises: a tuner input; an image reject mixer adapted to perform image rejection by phase cancellation; and a single tracking filter between said mixer and said tuner input, wherein said single tracking filter is of a relatively low Q type and said image reject mixer has a sufficiently wide dynamic range to reduce the effect of relatively high amplitude interference signals able to pass through said relatively low Q type tracking filter to said image reject mixer.

8. A video cassette recorder comprising an analog single conversion television tuner which comprises: a tuner input; an image reject mixer adapted to perform image rejection by phase cancellation; and a single tracking filter between said mixer and said tuner input, wherein said single tracking filter is of a relatively low Q type and said image reject mixer has a sufficiently wide dynamic range to reduce the effect of relatively high amplitude interference signals able to pass through said relatively low Q type tracking filter to said image reject mixer.

9. An analog single conversion tuner comprising: a tuner input; an image reject mixer adapted to perform image rejection without image reject filtering; and a single tracking filter between said mixer and said tuner input, wherein said single tracking filter is of a relatively low p type and said image reject mixer has a sufficiently wide dynamic range to reduce the effect of relatively high amplitude interference signals able to pass through said relatively low Q type tracking filter to said image reject mixer.

* * * * *

UNITED STATES PATENT AND TRADEMARK OFFICE
CERTIFICATE OF CORRECTION

PATENT NO. : 7,006,162 B2  Page 1 of 1
DATED : February 28, 2006
INVENTOR(S) : Nicholas Paul Cowley et al.

It is certified that error appears in the above-identified patent and that said Letters Patent is hereby corrected as shown below:

Column 6,
Line 2, change "p type" to -- Q type --.

Signed and Sealed this

Twenty-third Day of May, 2006

JON W. DUDAS
*Director of the United States Patent and Trademark Office*